United States Patent [19]

Foxell

[11] 4,027,969

[45] June 7, 1977

[54] METHOD AND DEVICE FOR SIMULTANEOUS SCREENING OF SETS OF COLOR-SEPARATED HALF-TONE NEGATIVES

[76] Inventor: Gunnar Foxell, 5 Hovdingagatan, Hagersten, Sweden, S-126 52

[22] Filed: Dec. 17, 1974

[21] Appl. No.: 533,557

[30] Foreign Application Priority Data

Dec. 18, 1973 Sweden .............................. 7317056

[52] U.S. Cl. .................................. 355/73; 355/52; 355/76
[51] Int. Cl.² ................. G03B 27/60; G03B 27/64; G03B 27/68
[58] Field of Search .................. 355/52, 72, 73, 74, 355/75, 76

[56] References Cited

UNITED STATES PATENTS

| | | | |
|---|---|---|---|
| 1,945,481 | 1/1934 | Dilkes | 355/73 X |
| 2,130,793 | 9/1938 | Eliel | 355/52 X |
| 2,565,446 | 8/1951 | Abbott | 355/52 X |
| 3,617,122 | 11/1971 | Saito | 355/76 X |
| 3,692,407 | 9/1972 | Ramsay | 355/52 |

Primary Examiner—Edna M. O'Connor
Attorney, Agent, or Firm—Pollock, Vande Sande & Priddy

[57] ABSTRACT

Apparatus for simultaneous screening of sets of color-separated half-tone negatives, two or more registering images of the negatives can be projected simultaneously on photographic film by adjusting the configuration of the film support to counteract the distortion caused by the reproduction lens. For this purpose, a film support plate is devised, the surface of which can be locally deformed accordingly by adjustment of screw members.

5 Claims, 13 Drawing Figures

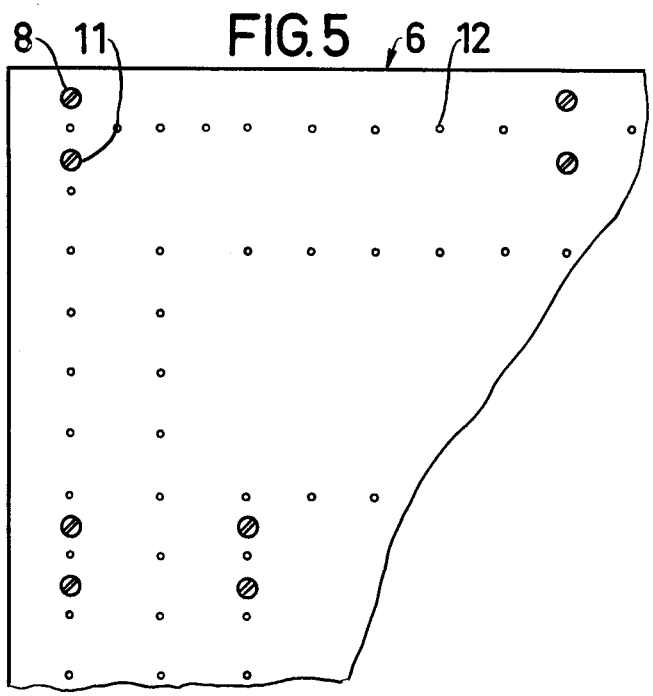
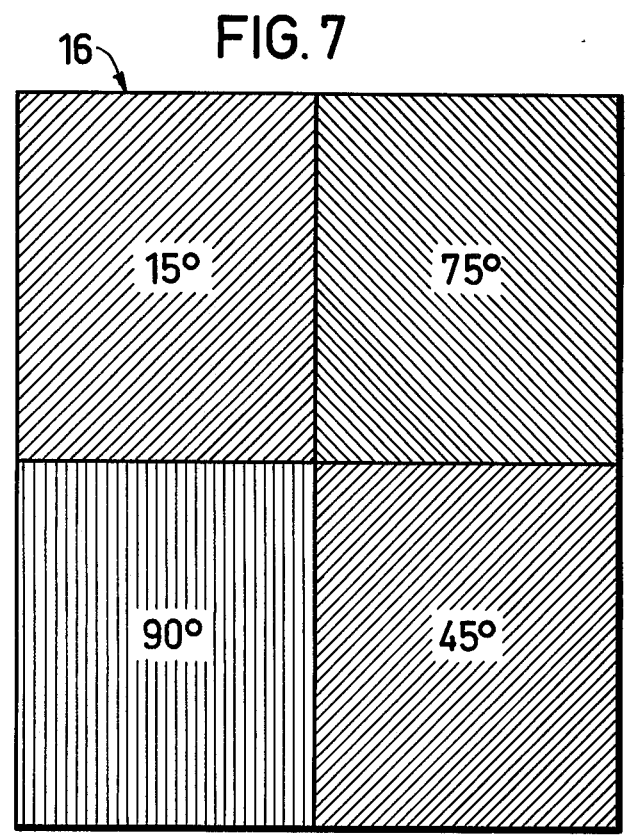

METHOD AND DEVICE FOR SIMULTANEOUS SCREENING OF SETS OF COLOR-SEPARATED HALF-TONE NEGATIVES

BACKGROUND OF THE INVENTION

This invention relates to colour reproduction methods wherein colour-separated half-tone negatives or half-tone positives are projected through contact screens on photographic film, for use in preparing printing plates. For convenience, the term "half-tone negatives" is intended to cover in the following specification and claims half-tone positives, as well, wherever applicable.

Priorly, known methods for producing screened film images for use in colour printing are slow and tedious, due to the fact that only one negative at a time is projected through a contact screen onto the photographic film to obtain one specific rate of enlargement. Since the number of half-tone negatives is normally four, i.e. one for each of the colours yellow, blue, red and black, four successive exposures must be made, each one through a contact screen the angular position of which is shifted for each exposure so as to avoid the forming of moire patterns in the end product.

The photographic film is held in close contact with a supporting surface by means of vacuum action exercised through a great number of minute holes connected to a vacuum source. Since all negatives of a set are geometrically alike and are brought to assume an identical position in the negative carrier, their images on the photographic film will become geometrically identical and will thus register perfectly, in spite of any distortion or faulty definition of the projected image caused by the imperfections of the projection lens.

It is obvious that the geometric or definition faults caused by the imperfections of the projection lens will not be self-correcting in this way if two or more associated negatives are projected in the same operation. The resulting images will differ and their registration will necessarily fall short of the standard required for good-quality colour reproduction.

SUMMARY OF THE INVENTION

A method by which several associated half-tone negatives may be reproduced in one operation with perfectly good registration between their images has been devised by the inventor, who has found a practicable way to solve the problem which involves the provision of methods and means by which the surface supporting the photographic film can be made to assume a configuration that counteracts effectively the distortion caused by the optical system.

To attain this purpose and to make possible the reproduction of half-tone negatives by a simplified procedure which can be carried out with a very substantial saving of time, the invention provides a method of screening half-tone negatives (or half-tone positives) which is characterized by the steps of mounting at least two and preferably four associated colour-separated half-tone negatives in a negative carrier, inserting the negative carrier in a projecter operable to project an image onto a plate adapted for holding by suction a sheet of photographic film in close relationship thereto, deforming the free surface of said plate into a configuration that will counteract the effects of reproduction lens distorsion so as to make the projected part-images geometrically identical, placing a photographic film on said surface, superposing on said film a contact screen with different angular orientation for each part-image, exposing the film and processing the exposed film.

The invention also provides suitable means for screening half-tone negatives. These means comprise a rigid base plate and a superposed relatively thin support plate of resiliently deformable metallic material such as steel, said support plate being pierced by a great number of minute holes for connecting to a vacuum source, there being spaced groups of further holes extending through the thickness of the plate, one hole in each group being shaped with threads and another hole being smooth and having a widened upper portion, set screws engaging the threaded holes and extending below the bottom surface of the plate or not, depending on adjustment, further screws provided with heads inserted in the smooth holes and engaging threaded holes in the baseplate, all screws leaving the upper side of the plate unobstructed and operative to exercise a pushing and pulling action on the support plate relative to the base plate so as to adapt the configuration of the support plate to an image projected onto the upper surface thereof, to counteract the effects of optical distortion on the image.

Other features, characteristics and advantages of the invention will become obvious from the following description of embodiments given by way of example and illustrated in the drawings.

BRIEF DESCRIPTION OF THE DRAWINGS

FIG. 5 is a fragmentary view of the plate in FIG. 3 on a greater scale. FIG. 7 shows a combination contact screen with four screening angles.

DESCRIPTION OF THE PREFERRED EMBODIMENT

Figure 1:
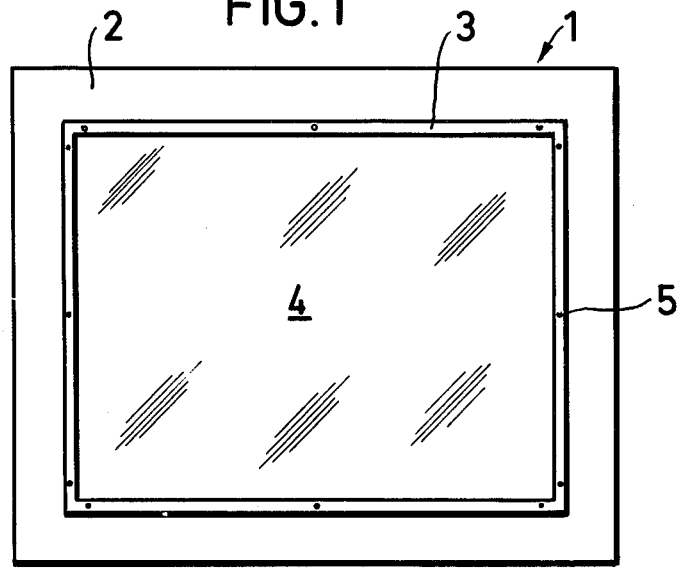
FIG. 1 is a diagrammatic plan view of a negative carrier.

The negative carrier shown in FIG. 1 is a designed for use with the improved screening method provided by the invention. The negative carrier 1 comprises a rectangular frame 2 formed at its inner circumference with a ledge or step 3, the free edge of which defines the light opening of the frame. Two superposed glass plates 4 are accurately fitted in the frame for holding negatives between them. Different grey filters may also be held by the carrier in a known manner to compensate for different densitometric values of a set of a half-tone negatives held by the carrier. The number of negatives held at the same time will typically be four or two. This corresponds to the four reproduction colours yellow, blue, red and black.

Figure 2A:
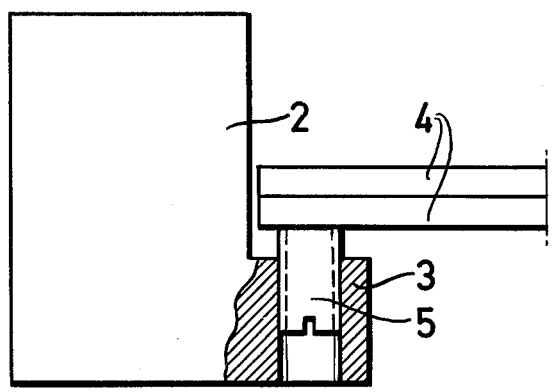
FIGS. 2a and 2b are fragmentary sectional views on a larger scale of the negative carrier in FIG. 1.
Figure 2B:
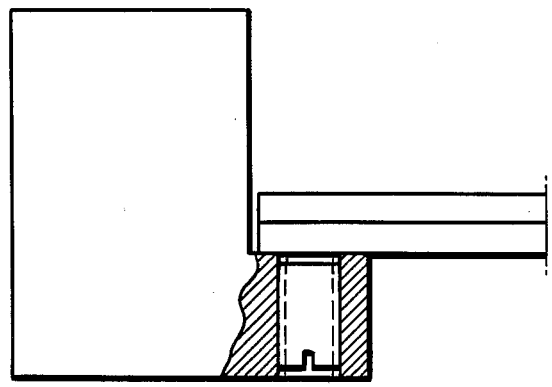

The negatives must lie in a plane parallel to the projection surface to enable the simultaneously projected images of up to four half-tone negatives together covering a considerable area, to become correctly defined over the whole image field. To this end, adjusting screws 5 are provided in the negative carrier, and can be set to project more or less above the ledge 3 when actuated from below. FIG. 2a and 2b show on a larger scale the carrier frame 2 with the glass plates 4 which repose upon the screws 5, or directly upon the ledge, or partly on both, depending on the adjusted positions of the screws 5.

Figure 3:
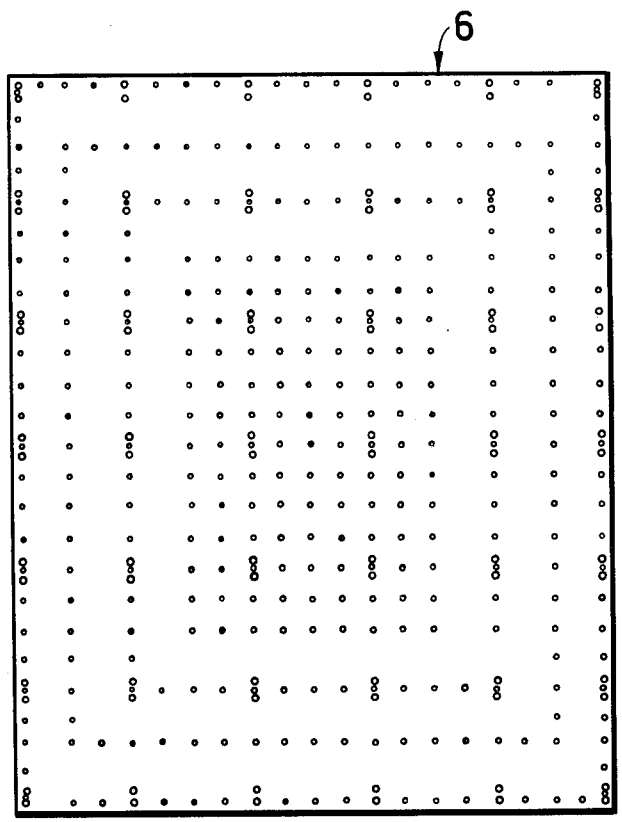
FIG. 3 is a plan view of a support plate with suction holes and bores for set and clamping screws.
Figure 4:
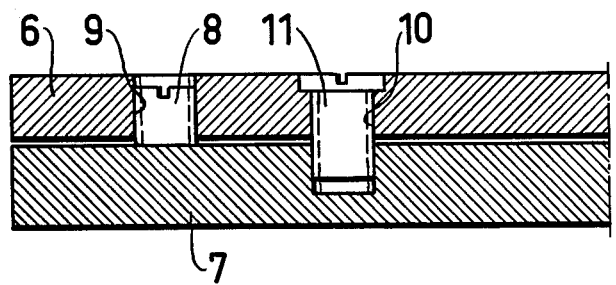
FIG. 4 shows on a larger scale a fragmentary sectional view of a vacuum plate and a superposed support plate.

With reference to FIG. 3 and 4 there is provided, according to the invention, a relatively thin plate 6 made of metal, such as steel or brass and affording a support for the photographic film. This plate is superposed on a rigid bottom plate 7, such as a conventional vacuum plate. Set screws 8 engage spaced threaded holes 9 through plate 6 and can be adjusted to project below the underside of plate 6. In order to secure the engagement of all screws 8 with the upper side of plate 7 there is drilled in plate 6 near each hole 9 a hole 10 for a clamping screw 11 engaging with its head an enlarged upper portion of the hole 10. The screws 11 engage threaded holes in the bottom plate 7. Screws 8 and 11 leave the upper surface of plate 6 unobstructed. By different setting of the screws 8 and 11 such deformation and surface configuration of the resilient plate 6 is possible to obtain, that the optical distorsion of the projected images is counteracted, and good registration of the images will be obtained.

FIG. 5 illustrates on a larger scale a portion of plate 6 with suction holes 12 and screws 8 and 11 in spaced relationship all over the plate surface. In operation the suction holes 12 are connected to a vacuum source (not shown) in well-known manner.

Figure 6:
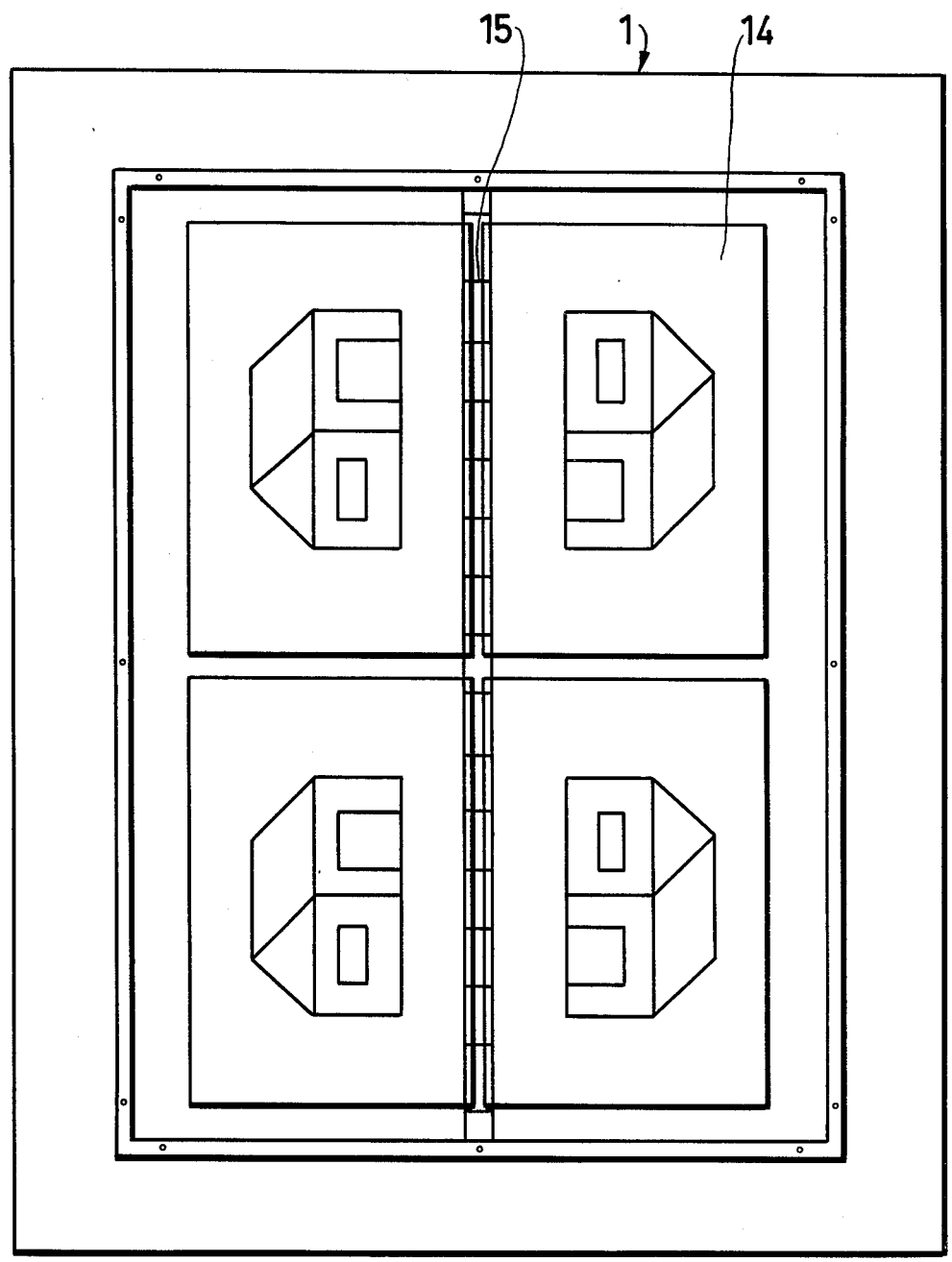
FIG. 6 is a plan view of a negative carrier with registering marks and four negatives.

As shown in FIG. 6 four juxtaposed negatives 14 (not illustrated as half-tone negatives) are mounted in the negative carrier 1, and their position is carefully adjusted according to register markings 15 interposed between and below the negatives, respectively. An image of these negatives is projected on the photographic film supported by the plate 6 and adhering thereto by vacuum action. By virtue of the accurate coincidence between the surface of the plate 6 and the curved image field, the projected image will suffer the least possible distortion.

FIG. 7 illustrates a combination screen 16 with four elementary screens. The screening angles are different for the four elementary screens, to suppress the moire effect in known manner. The combination screen may be made integrally, or may be joined together from four separate pieces.

Figure 8B:
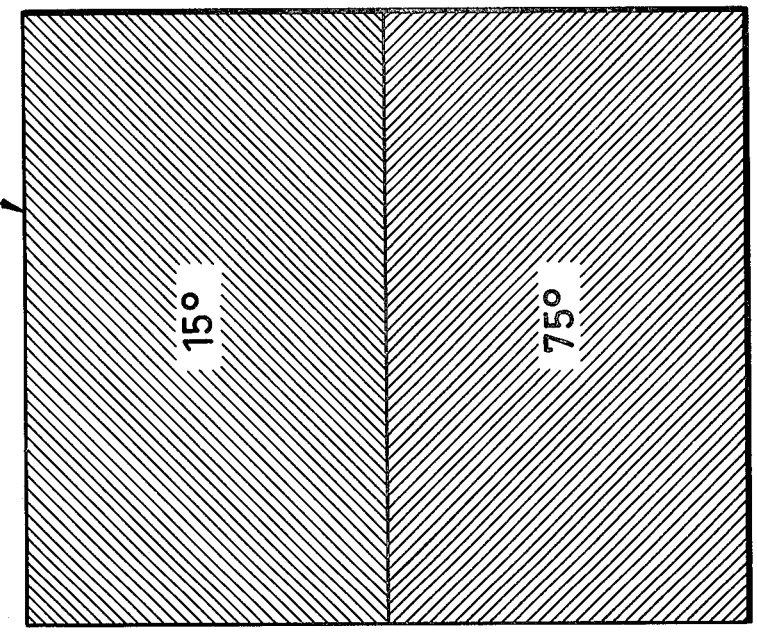
FIG. 8a and 8b show each a combination screen with two screening angles.
Figure 8A:
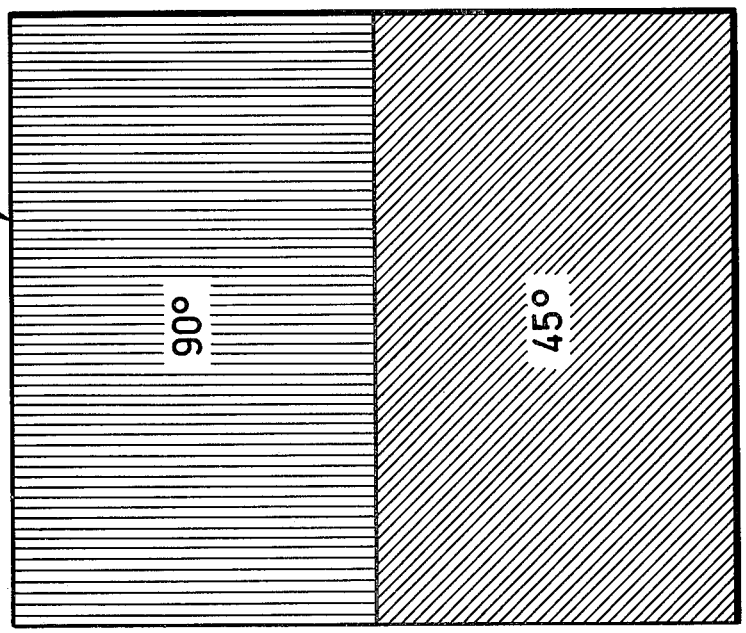

FIGS. 8a and 8b illustrate two combination screens 17 and 18, respectively, each comprising two elementary screens. In some reproduction work, it may be advisable or necessary, for instance when sizes are large, to carry out two succesive screening operations, with two half-tone negatives each time. In such case, there will still be a considerable saving of time and work compared with the conventional method with screening of a single negative at a time.

Figure 9A:
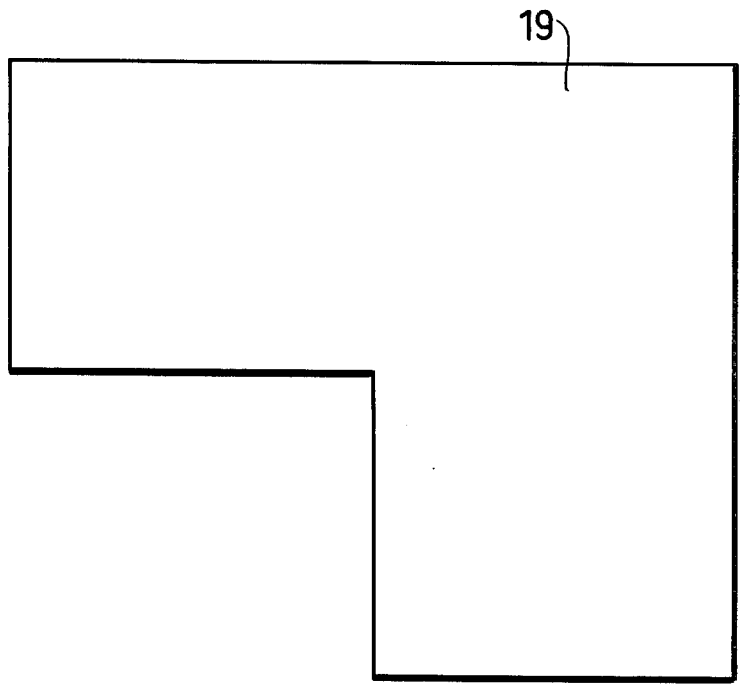
FIG. 9a, 9b and 9c show different masking members.
Figure 9B:
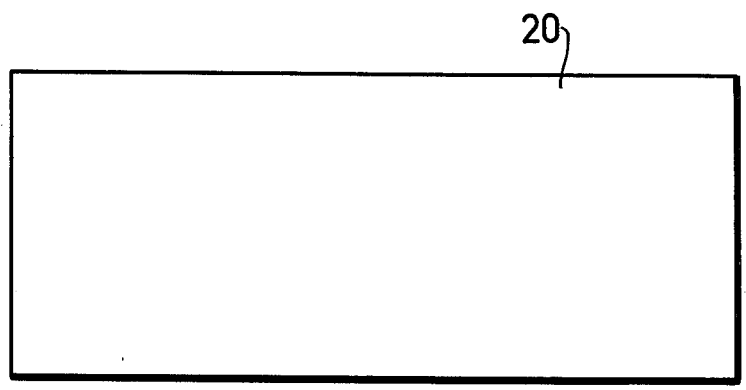
Figure 9C:
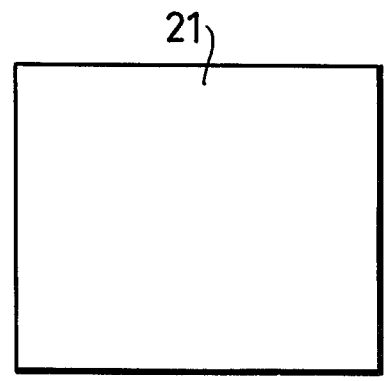

FIGS. 9a, 9b and 9c illustrate as examples opaque masking devices 19, 20 and 21 which are employed when it is desired to "hold back" one or more negatives in the reproduction, to attain a balancing effect when screening.

In practice, the invention has been found to give consistently good results for a given reproduction lens within a useful reproduction range.

What I claim is:

1. Apparatus for use in screening half-tone negatives comprising:
   a rigid base plate and a superposed relatively thin support plate of resiliently deformable material,
   said support plate being pierced by a great number of minute holes for connecting to a vacuum source and having spaced groups of further holes extending through the thickness of the support plate, one hole in each group being threaded and another hole being smooth and having a widened upper portion,
   set screws engaging the threaded holes and extending below the bottom surface of the support plate or not, depending on adjustment,
   further screws provided with heads inserted in the smooth holes and engaging threaded holes in the base plate, all screws leaving the upper side of the support plate unobstructed and being operative to exercise a pushing and pulling action on the support plate relative to the base plate so as to adapt the configuration of the support plate to an image projected onto the upper surface thereof to counteract the effects of optical distortion on the image.

2. The apparatus of claim 1 which further includes a screen comprising a plurality of elementary screens with different screening angles forming a one-piece combination screen.

3. The apparatus of claim 1 which further includes a negative carrier for supporting a negative whose image is to be projected onto a photosensitive material supported on said support plate, said negative carrier including two superposed glass plates for interposing half-tone negatives therebetween and carried by a supporting surface, and a plurality of adjusting screws projecting upwardly from said supporting surface for skewing the said glass plates relative to said supporting surface.

4. Apparatus for use in screening half-tone negatives comprising:
   plate means comprising a deformable upper plate for supporting photographic film thereon and an underlying lower rigid plate which is fixedly secured,
   means for projecting concurrently onto the film a separate image of each of the negatives,
   means for effecting controlled local deformationof said upper plate comprising screw means passing through apertures at spaced locations on said upper plate and coacting with said lower rigid plate to selectively adjust the spacing at each of the spaced locations between said upper plate and said lower plate,
   said deforming means permitting said upper plate having the image of one of the negatives projected thereon to be adjusted to a desired non-planar configuration independently of the deformation of the part of the upper plate on which is projected the image of another one of the negatives.

5. The apparatus of claim 4 wherein each said screw means lies below the upper surface of said plate means.

* * * * *